United States Patent
Chalopin et al.

(10) Patent No.: US 7,600,068 B2
(45) Date of Patent: Oct. 6, 2009

(54) PROGRAMMABLE CONTROL INTERFACE DEVICE

(75) Inventors: Herve Chalopin, Aubagne (FR); Laurent Tabaries, Aubagne (FR)

(73) Assignee: STMicroelectronics S.A, Montrouge (FR)

( * ) Notice: Subject to any disclaimer, the term of this patent is extended or adjusted under 35 U.S.C. 154(b) by 339 days.

(21) Appl. No.: 11/218,337

(22) Filed: Sep. 1, 2005

(65) Prior Publication Data

US 2006/0095692 A1 May 4, 2006

(30) Foreign Application Priority Data

Sep. 3, 2004 (FR) .................................. 04 09362

(51) Int. Cl.
*G06F 13/36* (2006.01)
*G06F 9/455* (2006.01)
*G06F 13/00* (2006.01)

(52) U.S. Cl. ........................... 710/311; 703/25; 711/155
(58) Field of Classification Search ................. 710/311; 703/25; 711/155, 154
See application file for complete search history.

(56) References Cited

U.S. PATENT DOCUMENTS

| | | | | |
|---|---|---|---|---|
| 4,019,175 A | * | 4/1977 | Nakao et al. ................. | 711/115 |
| 4,550,366 A | * | 10/1985 | Toyama et al. ................. | 700/7 |
| 5,111,385 A | * | 5/1992 | Hattori ........................ | 711/157 |
| 5,386,518 A | | 1/1995 | Reagle et al. ................ | 395/325 |
| 5,438,535 A | * | 8/1995 | Lattibeaudiere .......... | 365/49.17 |
| 5,581,741 A | * | 12/1996 | Clark et al. ..................... | 703/25 |
| 5,761,533 A | * | 6/1998 | Aldereguia et al. ........... | 710/25 |
| 5,802,587 A | * | 9/1998 | Ishikawa et al. ............. | 711/155 |
| 6,038,400 A | * | 3/2000 | Bell et al. ..................... | 710/11 |
| 6,275,895 B1 | * | 8/2001 | Tabo ........................... | 711/106 |
| 6,288,566 B1 | * | 9/2001 | Hanrahan et al. .............. | 326/38 |
| 6,304,510 B1 | * | 10/2001 | Nobunaga et al. ....... | 365/230.06 |
| 6,493,776 B1 | * | 12/2002 | Courtright et al. ........... | 710/110 |
| 6,526,340 B1 | * | 2/2003 | Reul et al. ..................... | 701/29 |
| 6,687,255 B1 | * | 2/2004 | Holm et al. .................. | 370/412 |
| 6,721,872 B1 | * | 4/2004 | Dunlop et al. ................ | 712/28 |
| 6,754,749 B1 | * | 6/2004 | Mounsef et al. ............. | 710/100 |
| 6,978,322 B2 | * | 12/2005 | Park ............................. | 710/16 |
| 7,034,838 B2 | * | 4/2006 | Obata et al. .................. | 345/537 |
| 7,093,033 B2 | * | 8/2006 | Beckett et al. ................ | 710/11 |
| 7,093,082 B2 | * | 8/2006 | Ryan ........................... | 711/147 |
| 7,161,870 B2 | * | 1/2007 | Zitlaw et al. ........... | 365/230.06 |
| 7,162,564 B2 | * | 1/2007 | Vinnakota et al. ........... | 710/308 |

(Continued)

FOREIGN PATENT DOCUMENTS

GB 2 221 328 A 1/1990

*Primary Examiner*—Khanh Dang
*Assistant Examiner*—Christopher A Daley
(74) *Attorney, Agent, or Firm*—Lisa K. Jorgenson; Robert Iannucci; Seed IP Law Group PLLC

(57) ABSTRACT

A programmable control interface is for circuits using complex commands. The programmable interface includes a memory for storing sampled commands and a sequencing circuit. The sequencing circuit is programmable. Thus, a processor downloads into the programmable interface a sequencing specific to the sequence of commands. Once the programmable interface has been programmed, the processor launches the start of the sequence and the programmable interface manages and controls in a standalone manner the inputs/outputs with the slave circuit. The management and control of the slave circuit is independent of any interrupt specific to the system. The programmable interface uses a software-type upgrade to interface with new slave circuits that may appear on the market.

20 Claims, 10 Drawing Sheets

U.S. PATENT DOCUMENTS

| | | | |
|---|---|---|---|
| 7,164,613 B2 * | 1/2007 | Fekih-Romdhane et al. | 365/201 |
| 2002/0144183 A1 * | 10/2002 | Abdo et al. | 714/37 |
| 2003/0131161 A1 * | 7/2003 | Dodd et al. | 710/35 |
| 2004/0054864 A1 | 3/2004 | Jameson | 711/167 |
| 2004/0221078 A1 * | 11/2004 | Samuel et al. | 710/107 |
| 2005/0034021 A1 * | 2/2005 | Fukuyama | 714/30 |

* cited by examiner

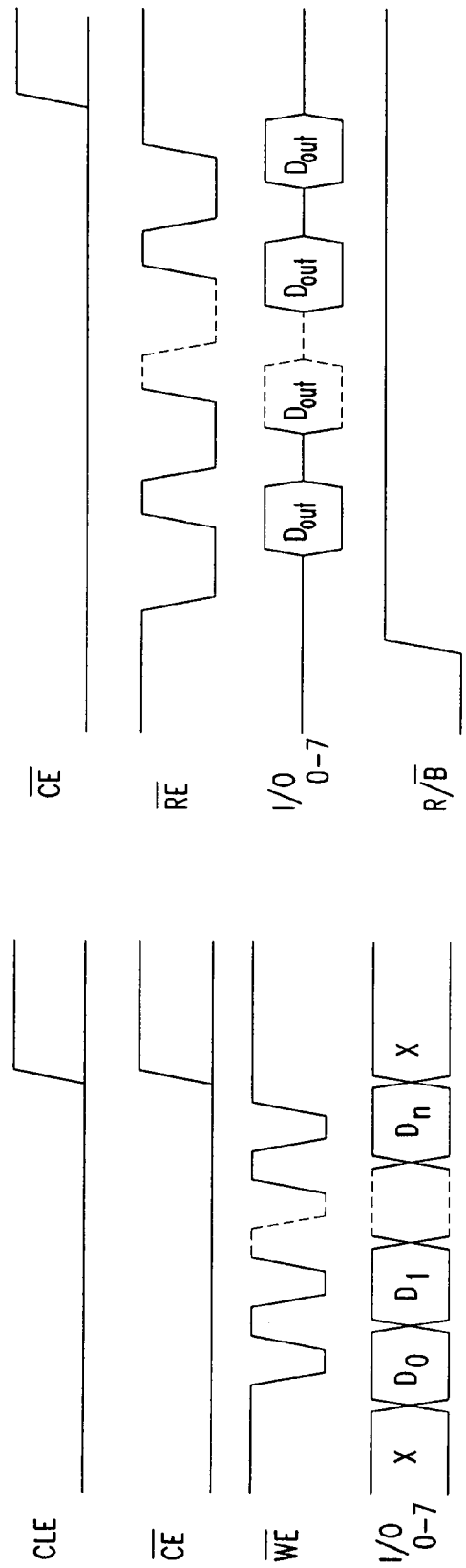

FIG. 9B

| 120 | 121 | 122 | | | 123 | | | 124 | |
|---|---|---|---|---|---|---|---|---|---|
| MEM D | MEM C | COUNTER @ DATA | | | COUNTER @ COMMANDS | | | C CONTROL | |
| R/W ACTIV | R/W ACTIV | INC | LOAD | @ | INC | LOAD | @ | COND | STOP |

PROGRAMMABLE CONTROL INTERFACE DEVICE

BACKGROUND OF THE INVENTION

1. Field of the Invention

The invention pertains in a general manner to circuit interfacing in a processor-based electronic system. More particularly, the invention pertains to a programmable control interface device for interfacing a slave circuit requiring complex commands.

2. Description of the Related Art

The complexity of circuits leads to a complexity of command. Among the circuits requiring complex commands may be cited the integrated circuit memories, in particular the large capacity memories of E²PROM or FLASH type. If one wishes to have, for a central processor-based system, a universal memory reader, for example to read memories of different type, it is necessary to have a control interface which is compatible with all the memories available on the market. Such an interface can currently be embodied in two different ways.

A first embodiment consists in performing software management of a standard input/output bus. The central processor then controls the state of each input/output linked to the memory which is linked to input/output ports. The use of a central processor to carry out this kind of function in a software manner requires wide use of the resources of the processor. The central processor is thus almost monopolized by this simple management of the inputs/outputs. Moreover, if an interrupt originating from the system managed by the central processor occurs in the middle of a write or read sequence in the said memory, this sequence is interrupted, and, in certain cases, this may require the complete repetition of the sequence.

A second embodiment consists in using a hardware interface Which itself manages the various possible memories. To do this, the hardware interface must be capable of controlling all the types of memory. Accordingly, it must be furnished with means making it possible to control and sequence each type of memory. A drawback is that the upgrading of the products cannot be taken into account by this type of circuit. In general, when a new circuit to be controlled, such as for example a new memory, a new microcontroller or any other circuit with complex commands, arrives on the market, the hardware interface must then be changed.

BRIEF SUMMARY OF THE INVENTION

The invention proposes a solution to the problems mentioned above. According to the invention, a programmable control interface is embodied for circuits requiring complex commands. The programmable interface of one embodiment of the invention comprises a memory storing sampled commands and a sequencing circuit. The sequencing circuit is itself programmable. Thus, before starting a control sequence, the processor loads into the programmable interface the sequencing specific to the said sequence of commands. Once the control interface has thus been programmed, the processor launches the start of the sequence and the programmable control interface can thereafter manage in a standalone manner the entirety of the input/output operations with the slave circuit to be controlled. The management of the circuit to be controlled is then independent of any interrupt specific to the system. Moreover, the interface requires only a software type upgrade when a new circuit to be controlled appears on the market.

According to a first aspect, the invention is a programmable interface device for controlling a slave circuit. Any control signal intended to control the slave circuit is previously decomposed into a succession of bits, the said succession corresponding to a sampling of the said signal with the aid of a sampling signal, a period of which is at most equal to the smallest duration between two changes of state of a control signal. The device comprises a first memory for storing the commands sampled, a first address counter for supplying addresses to the said first memory, a programmable state machine for driving the first memory and the first address counter.

For slave circuits requiring a heavy exchange of data, the device furthermore comprises a second memory for storing data destined for or originating from the slave circuit, a second address counter for supplying addresses to the said second memory, the second address counter being driven by the programmable state machine.

According to one embodiment, the first memory is designed to store, furthermore, addresses destined for the slave circuit. The first memory is designed, furthermore, to store control words destined for the slave circuit.

According to another embodiment, the second memory is designed, furthermore, to store addresses destined for the slave circuit. The second memory is designed, furthermore, to store control words destined for the slave circuit.

According to another aspect, the invention is an electronic system comprising at least a central processor furnished with a central bus for exchanging data, addresses and/or commands with other circuits, a memory storing at least one set of complex instructions corresponding to at least one slave circuit, the memory being coupled to the central bus, a programmable interface device coupled to the central bus.

The device and/or the system are, for example, integrated into an integrated circuit, the system being embodied in the form of an on-chip system.

The invention also concerns a method of control of a slave circuit by a system with central processor with the aid of a programmable control interface device, in which any control signal, intended to control the slave circuit, is decomposed into a succession of bits by sampling with the aid of a sampling signal, a period of which is at most equal to the smallest duration between two changes of state of a control signal, the programmable interface device comprising a first memory, a first address counter, and a programmable state machine. The method comprises the steps of computation by the processor of a series of sampled commands, computation of a succession of states corresponding to the command series, loading into the programmable device of the sampled command series and of the succession of states, and of supplying to the first memory and to the first counter, by the state machine, of the instructions providing on an output bus the signals intended for commanding the slave circuit.

BRIEF DESCRIPTION OF THE SEVERAL VIEWS OF THE DRAWINGS

The invention will be better understood and other features and advantages will become apparent on reading the description which follows, the description making reference to the appended figures among which:

FIGS. 5 to 8 show a decomposition of elementary commands for the slave circuit, according to one embodiment of the invention;

FIGS. 9A to 9B represent an exemplary sequencing for a complex command, according to one embodiment of the invention;

DETAILED DESCRIPTION OF THE INVENTION

Figure 1:
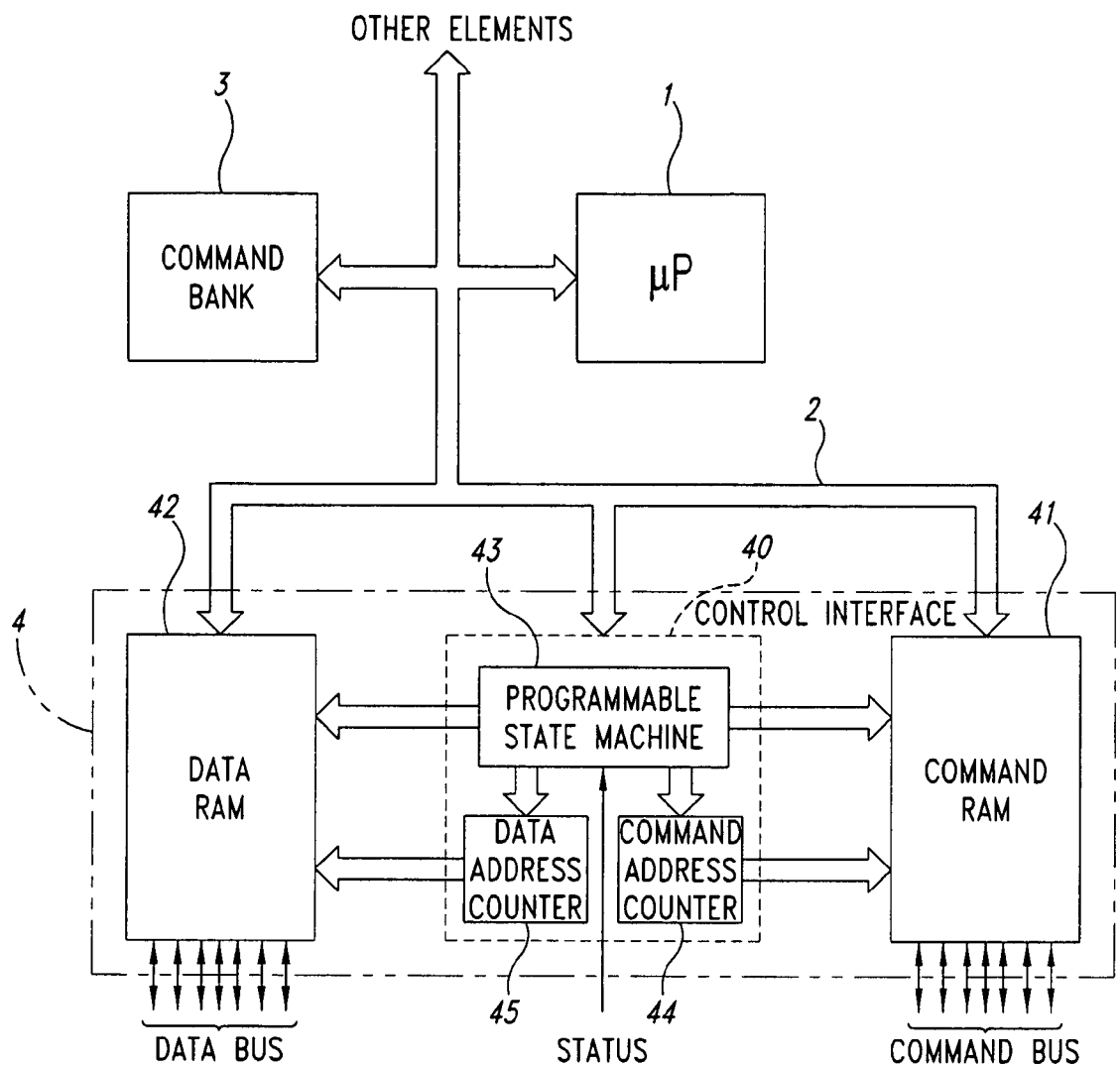
FIG. 1 represents a microprocessor system incorporating a programmable interface device according to one embodiment of the invention.

FIG. 1 represents a computing system using a central processor 1 furnished with a central bus 2. The computing system comprises numerous elements that are not represented in the figure but are necessary for its proper operation among which may be cited random access memory, display interface, communication interface, modem, etc. As far as the invention is concerned, there is represented a command bank 3 which is in fact a memory, either an independent memory, or a memory forming part of the central memory of the central processor 1. The command bank 3 comprises all the possible commands for all the slave circuits that one wishes to connect to a programmable control interface 4. The command bank 3 corresponds to a command bank of a software system of the prior art. According to the invention, this command bank 3 is reused with the programmable control interface 4 which is the subject of the invention.

In the preferred example, represented in FIG. 1, the programmable control interface 4 mainly comprises a drive circuit 40, a command memory 41 and a data memory 42. The drive circuit 40, the command memory 41 and the data memory 42 are linked to the central bus 2 so as to be able to be programmed directly by the central processor 1. The drive circuit 40 mainly comprises a state machine 43 which is programmable, a command address counter 44 and a data address counter 45. The state machine 43 and the command address counter 44 instruct the command memory 41 when the command programmable interface 4 operates in a standalone manner. Likewise, the state machine 43 and the data address counter 45 provide for the driving of the data memory 42. The data and command address counters 44 and 45 are themselves driven by the state machine 43. The state machine 43 is moreover furnished with a signal input intended to receive a state signal originating from a slave circuit to be controlled.

The command memory 41 will contain data which correspond for each bit to a control signal to be sent to the slave circuit to be controlled. These data are loaded directly by the central processor 1 which will compute the sampled sequence of commands to be recorded in the said command memory 41 on the basis of the command bank 3 and of the operation to be performed on the slave circuit. The central processor 1 will also program the drive circuit 40 so that the state machine 43 can correctly drive the address counter 44 and thus synchronize with the aid of commands the command memory 41. Furthermore, the central processor 1 indicates a frequency of gating to the drive circuit 40 so that the latter can synchronize the signals supplied by the control bus corresponding to the data bus of the memory 41 at a frequency such that the control signals can control the slave circuits in an optimized manner. The data memory 42 serves in the case where the slave circuit is furnished with a data bus for reading or writing data from or to the said slave circuit. This is the case in particular when the slave circuit is a circuit of large capacity memory type, for example of FLASH type. The central processor 1 or a Direct Memory Access (DMA) device (not represented) will perform a data transfer between a memory or an interface (not represented) of the central processor 1 and the data memory 42. This data memory 42 will serve as buffer between the computing system and the slave circuit. The data bus of the data memory 42 is used as bidirectional data bus in relation to the slave circuit. The state machine 43 and the address counter 45 drive this data memory 42, the central processor 1 having provided the drive circuit 40 with instructions which likewise relate to this data memory 42 simultaneously with the instructions which relate to the command memory 41.

Thus, when a sequence of commands needs to be sent to the slave circuit, for example the writing of a page of data into a FLASH type memory, the central processor 1 computes a sampling of commands to be sent on the basis of the elements present in the command bank 3 and sends the said sequence to the command memory 41 by way of the central bus 2. The central processor 1 also controls an exchange of data between its central memory (not represented) and the data memory 42. This central processor 1 fixes the frequency of gating of the drive circuit 40 and provides the instructions necessary to the programmable state machine 43 so that the latter effects the driving, on the one hand, of the command memory 41 and, on the other hand, the data memory 42 when the complex command of the slave circuit is being carried out.

Figure 2:
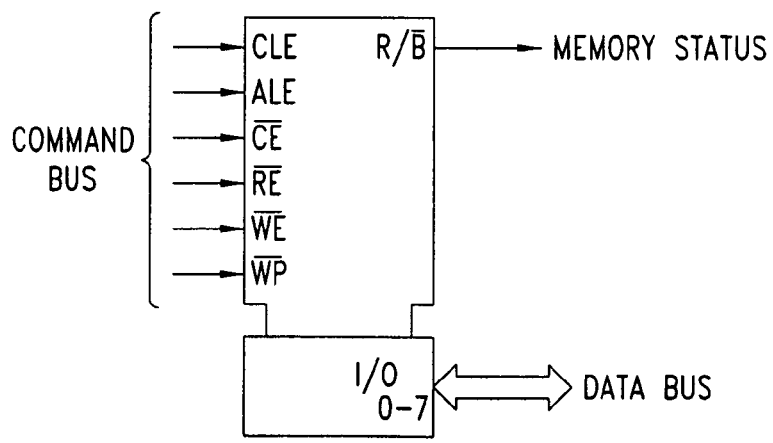
FIG. 2 represents an exemplary slave circuit.

FIG. 2 represents an exemplary slave circuit. This slave circuit is for example a 64-megabyte FLASH memory. This type of memory is commonly used as mass memory, and serves in numerous applications, such as for example photographic camera, apparatus for recording and reading digital music and also camera, etc. This type of memory has the main advantage of being a fairly compact mass memory. On the other hand, a drawback of these memories stems from their slowness as compared with a RAM type volatile memory. This type of memory for reasons of speed of addressing but also for physical reasons is divided into a plurality of groups. Among these groups, the memory comprises, for example, four memory areas, each memory area itself comprising 1024 blocks, each block comprising 32 pages, and each page being divided into two data planes each comprising 256 bytes, to which must be added a redundant plane of, for example, 16 bytes which serves to record a signature of the data included in the remainder of the page.

In order to accelerate data transfers between this type of memory and a system using it, complex instructions address themselves to a data group, which may be of variable size, rather than to one data item. The instructions will address themselves either to a data item, or to a page or to a page segment, or to a block and to an area or to a plurality of areas of the said memory. Moreover, in order to limit the number of connections between the memory circuit and a circuit using it, instruction, address and data words are multiplexed on one and the same bus. In the example shown in FIG. 2, the slave circuit has first to sixth command inputs, a status output, and a data bus, for example, an eight-bit bus, here denoted $I/O_{0-7}$.

The first input of the slave circuit receives a command enable signal CLE (standing for Command Latch Enable). The second input receives an address enable signal ALE (standing for Address Latch Enable). The third input receives a circuit enable signal $\overline{CE}$ (standing for Chip Enable). The fourth input receives a Read Enable signal $\overline{RE}$. The fifth input receives a Write Enable signal $\overline{WE}$. The sixth input receives a write protect signal $\overline{WP}$ (standing for Write Protected). The status output supplies a detail of availabilities R/$\overline{B}$ (standing for Ready/Busy). The availability signal R/$\overline{B}$ indicates, depending on its state, whether the memory is available or whether the latter is unavailable. The data bus $I/O_{0-7}$ is a bidirectional bus intended to receive and to supply data but also intended to receive addresses and command words corresponding to complex commands.

Such a circuit is furnished for example with a set of complex commands, such as indicated in the table below:

TABLE OF COMMANDS

| COMMAND | 1st WORD | 2nd WORD | 3rd WORD |
| --- | --- | --- | --- |
| Read A | 00h/01h | | |
| Read B | 50h | | |
| Read ID | 90h | | |
| Initialization | FFh | | |
| Programming of multiple page | 80h | 10h | |
| Programming of simple page | 80h | 11h | |
| Copying of multiple page | 00h | 8Ah | 10h |
| Copying of simple page | 03h | 8Ah | 11h |
| Erasure of block | 60h | D0h | |
| Erasure of multiple block | 60h ... 60h | D0h | |
| State reader | 70h | | |
| Multiple state reader | 71h | | |

In this table it may be seen that there are three read commands, one of which has two command words. Thus the instruction Read A is a reading from an address over a certain length not exceeding, for example a memory page. The use of two codes 00h and 01h (the "h" signifying a hexadecimal number) serves to address each plane of a page independently. The instruction Read B, coded 50h, serves to read the redundant plane alone. A Read of 528 successive bytes onwards of the first address of the first plane will supply the 256 bytes of the first plane, the 256 bytes of the second plane, then the 16 bytes of the redundant plane. The instruction Read ID, coded 90h, serves to read identification data specific to the memory circuit which are, for example the serial number of the component, its manufacturing identification number, the manufacturing plant, etc. An initialization instruction, coded FFh, is also available. Instructions for page programming, coded 80h+10h/11h, for copying a page from one block to another block of the memory, coded 00h/03h+8Ah+10h/11h, for erasing a block, coded 60h+D0h, may be carried out in a simple manner or multiple manner, that is to say chained. Instructions, coded 70h/71h, which also allow the reading of the state of the memory are available to ascertain if everything has run properly after one or more write or erase operations.

The complex commands may comprise a single command word, this being the case in particular for the read commands and for the memory reinitialization command. However two or three command words may also be necessary as may be seen in the table. To these command words must be added the addresses, whose size varies according to what is addressed, simple, page or block address, as well as the data if need be. Moreover, when successive commands are addressed to several areas of the memory, they may be managed in a chained manner so as to gain speed. Any complex command is divided into elementary commands controlled directly by the first and sixth inputs of the memory. These elementary commands make it possible to write a command, address or data word into the memory and also allows the reading of the memory.

Figure 3:
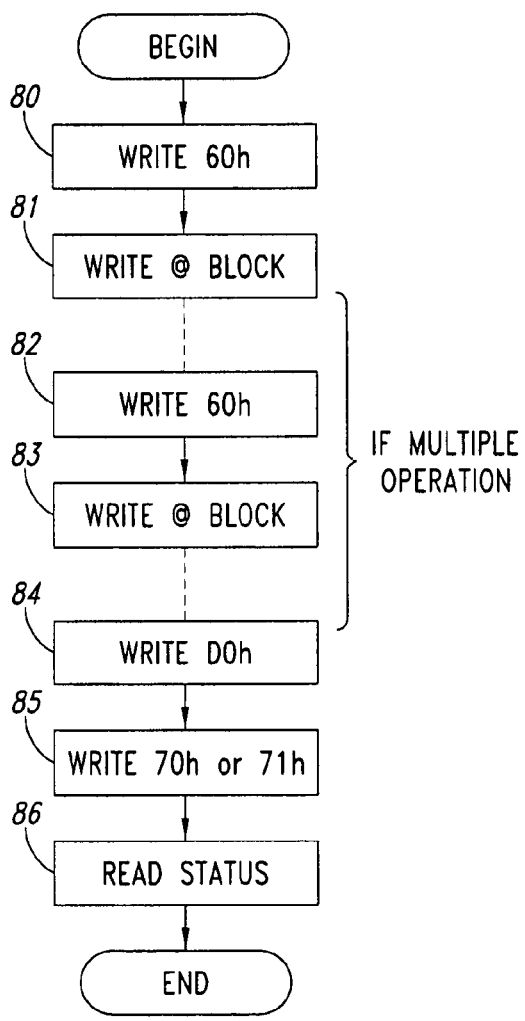
FIGS. 3 and 4 represent two examples of sequencing of complex commands for the circuit to be controlled, according to embodiments of the invention.

FIG. 3 represents the running of a complex command (also referred to as a complex instruction) intended to erase one or more blocks in the memory. In the course of a step 80, the memory must be instructed to read the word corresponding to the block erase command, for example 60h. This command being written to the memory, it is then appropriate to write the address of the block to be erased in the course of a step 81. If several blocks are to be erased, the steps 82 and 83 are repeated as many times as there are blocks to be erased, steps 82 and 83 being of the same nature as steps 80 and 81. A fifth step 84 writes the second command word of the block erasure instruction D0h, indicating that the block erase control instructions are terminated and that the memory can then proceed with the physical erasure of the said blocks. On completion of this command and in order to ascertain whether the erasure has run correctly, it is possible to chain a state read. Step 85 consists in writing the simple state read command 70h or multiple state read command 71h if several successive block erasure instructions have been done. This command having been written, it is appropriate to read the data emerging from the memory in the course of step 86.

If one wishes to write data within the memory, one resorts to programming instructions and in particular page programming instructions. These page programming instructions may also be chained over several memory areas and correspond to various addresses.

Figure 4:
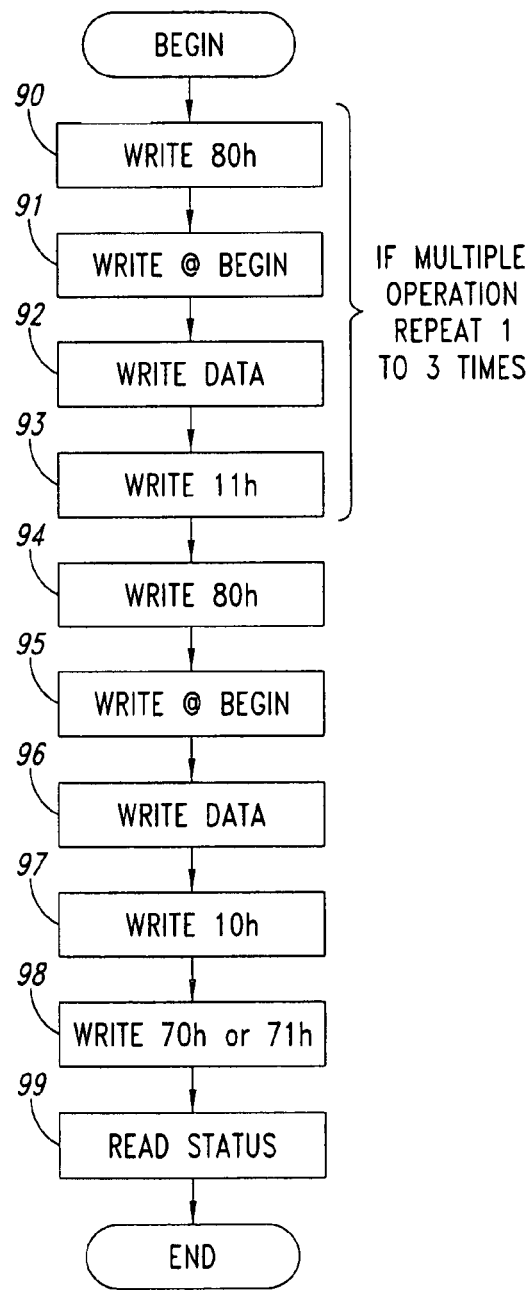

FIG. 4 illustrates the running of a complex command where at least two pages of the memory are written. In the course of a step 90, the command word 80h corresponding to the start of the programming instruction is written. In the course of a step 91, the address at which the start of the page write begins is written. In the course of a step 92, the data are supplied to the memory. The number of data supplied must be at most equal to the number of data remaining to be written in the page onwards of the write start address, including the two planes of the page and the redundant plane. In the course of a step 93, the second command word of the programming instruction 11h is written, which here indicates that it will be followed by a second programming operation. If a programming is performed in more than two areas, steps 90 to 93 are repeated. In the course of a step 94, the command word 80h corresponding to the programming of the last page is written. Step 95 makes it possible to write the start address for writing in the page considered. Step 96 consists in writing the data into the memory. Step 97 writes the second command word 10h which corresponds, on the one hand to the last programming operation and also to the launching of the internal operation of the programming memory itself. The latter concludes the write operation. To check the proper running of the write, a step 98 indicates to the memory that a state read is being carried out. The word 70h or 71h used is chosen depending on the number of pages written. A step 99 serves to read the outgoing data corresponding to the state requested.

As may be noted, these complex steps require the carrying out of a plurality of elementary steps of writing commands, of writing addresses, of writing data or of reading data. These elementary steps can be carried out directly with the command signals sent to the first to sixth inputs of the said memory.

The various elementary steps corresponding to all the possible cases involved are recorded in the command bank 3. This command bank will comprise the elementary steps of a plurality of types of slave circuits to be controlled and in particular the memory cited in the example.

Figure 5:
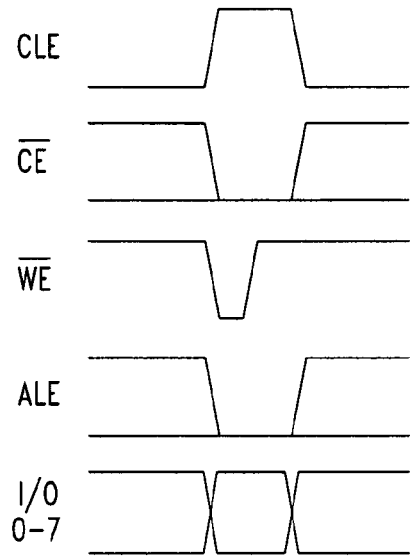

FIG. 5 represents the signals to be sent to the command inputs of the memory in order to write a control word. These signals are dictated by the information on the memory in question given by a constructor, as well as particular temporal prerequisites regarding the various durations to be used. In the case of this memory circuit, the observation of the various timeouts to be used shows that a time, for example of 25 nanoseconds (ns), can correspond to a minimum duration for performing a change of state on a signal. To write a command word, it is necessary that the command enable signal CLE be set to 1 during this write. It is also necessary that the slave circuit be selected as being active and this therefore requires that the circuit enable signal $\overline{CE}$ be in an active state, for example a low state. The write signal $\overline{WE}$ will also be used to write a word into the memory from the data bus I/O$_{0-7}$. The write itself is done on a rising edge of the write enable signal $\overline{WE}$. Thus, during the command write step, it is necessary to have a rising edge of this write signal $\overline{WE}$. The address enable signal ALE must for its part be placed in a low state. The read enable signal $\overline{RE}$ must remain inactive and be in our example held at the level 1. The write protect signal $\overline{WP}$ may be in any state whatsoever. The latter serves in fact essentially to make certain that when the circuit is powered up, the memory is not erased accidentally.

The command write step requires the memory to be available, so the availability signal R/$\overline{B}$ of the said memory must be set to 1 in order for it to be possible to carry out this step. These commands by virtue of the data of the constructor of the memory are therefore sampled at 25 ns.

Each signal is decomposed into a sequence 100 consisting of two bits. In the course of this sequence 100, only the write enable signal $\overline{WE}$ should go from 0 to 1. As regards the state of the signals before and after this command, they will depend essentially on the event occurring before or after. The central processor 1 will therefore load from the command bank 3 the data corresponding to the command signals which it will load into the command memory 41. These data will correspond to the succession of bits shown in this FIG. 5. On the other hand the command word possibly changing depending on the type of command to be performed, the central processor 1 writes, for example into the data memory 42, the desired command word. The command circuit 40 will for its part be set in such a way as to perform the sequencing consisting in outputting data from the command memory 41 twice although it will output the command word from the memory 42 only once.

Figure 6:
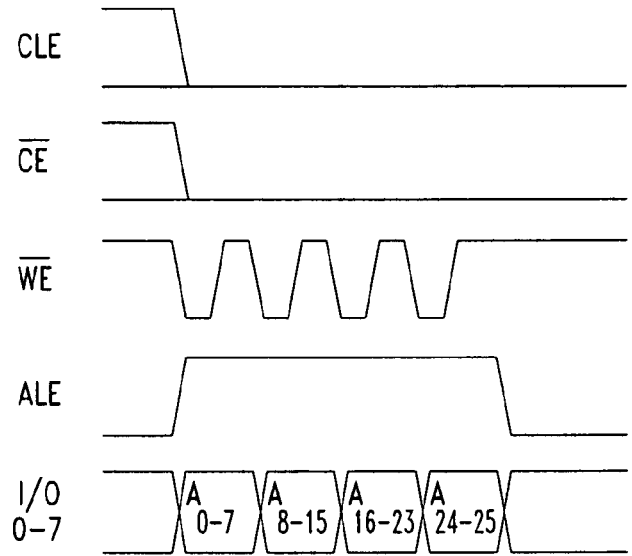

FIG. 6 shows the manner in Which a sequencing of an address write must take place. Before the start of the address write, the signals are set to a state which depends on what was previously sent. To write an address, the command enable signal CLE should be inactive, for example in the low state, the circuit enable signal $\overline{CE}$ should be active, for example in the low state, and write enable signal $\overline{WE}$ should change edge as many times as there are address words to be sent. The address enable signal ALE should likewise be active when the write signal changes state to switch from a low state to a high state and thus writes the address word which will be present on the data bus I/O$_{0-7}$. The read signal $\overline{RE}$ for its part should remain inactive, for example in the high state, and the write protect signal $\overline{WP}$ can be in any state. In the course of this address writing phase, it is not necessary for this memory to be available or not, thus it is not important to take account of the memory availability signal R/$\overline{B}$. In the case of our memory having 64 megabytes accessible per byte, the address is composed of 26 bits. Now, the memory has only a data bus I/O$_{0-7}$ of just 8 bits. Addressing is therefore carried out by the successive writing of three or four address words according to the addressing to be performed. Thus, it is possible to decompose an addressing sequence 101 of four words into four sub-sequences 102 intended to each write a different word of the address into the memory. Likewise, at the end of addressing, it is necessary to indicate that the addressing is finished and therefore to reset the address enable signal ALE to zero in the course of a sub-sequence 103. Thus, to write a complete address consisting of four address words, and considering the sampling done of the commands, it is necessary to employ nine command cycles. The command bank 3 will store the sub-sequences 102 and the sub-sequence 103 and when the processor writes the commands to be carried out into the command memory 41, it will recompose the complete addressing sequence 101 from the command bank 3 and will, for example, duplicate the sub-sequences 102 as many times as necessary. Moreover, the address words will be written to the data memory 42.

FIG. 7 represents the case of a data write relatively similar to an address write except that generally this data write concludes with the memory being made unavailable and that this data sequence should be sent only if the memory is available. This data write sequence 104 is composed of a plurality of sub-sequences 105 each aimed at writing a data item into the memory, the data item being written on the rising edge of the write signal $\overline{WE}$. The sub-sequences 105 are repeated as many times as there are data to be written.

FIG. 8 represents a data read step. The data read for its part is done when the write enable signal $\overline{WE}$ is inactive, for example at the level 1, when the command enable signal CLE and the address enable signal ALE are also inactive, for example at the 0 level. During the write, the read signal $\overline{RE}$ enables on a falling edge the request for subsequent data. This operation is repeated as many times as one wishes to output data from the memory. The latency time between the enabling of the subsequent data item and the arrival of this data item is generally variable as a function of the memory and of the supply voltages. The constructor indicates a maximum duration which, in this example, exceeds 25 ns. Accordingly, a data read sub-sequence 109 is sampled over three periods of 25 ns and corresponds to three bits for each command.

The read sequence 107 comprises at the start a standby sub-sequence 108. During this standby sub-sequence 108, the command signals remain stable on standby waiting for the availability signal R/$\overline{B}$ to switch to the level 1. As long as the availability signal R/$\overline{B}$ is at the low level, this standby sub-sequence 108 stops the operation to be performed. Once the availability signal R/$\overline{B}$ switches to the high state, the data read sub-sequences 109 proper are triggered. As stated previously, this sub-sequence 109 is sampled over three periods of 25 ns so as to be certain that a data item will be present on the data bus I/O$_{0-7}$ before the middle of the second period of the sub-sequence 109. Thus, the inputting of the data into the data memory 42 may be effected upon the transition between the second and the third period of each sub-sequence. The sub-sequences 109 are repeated until the last data item desired is obtained. On completion of sub-sequence 109, an end sub-sequence 110 is added. This end sub-sequence 110 corresponds to making the said memory reavailable. Here again, the central processor 1 will load from the command bank 3 the elementary sub-sequences 109 and 110 which will record in the command memory 41 and will indicate the sequencing to be followed to the command circuit 40. Once the operation of the data transfers has terminated, the data will have been stored in the data memory 42. The central processor 1 will then be able to perform or request a direct memory access circuit to perform the transfer from this data memory 42 to a central memory (not represented) of the computing system.

Figure 9A:
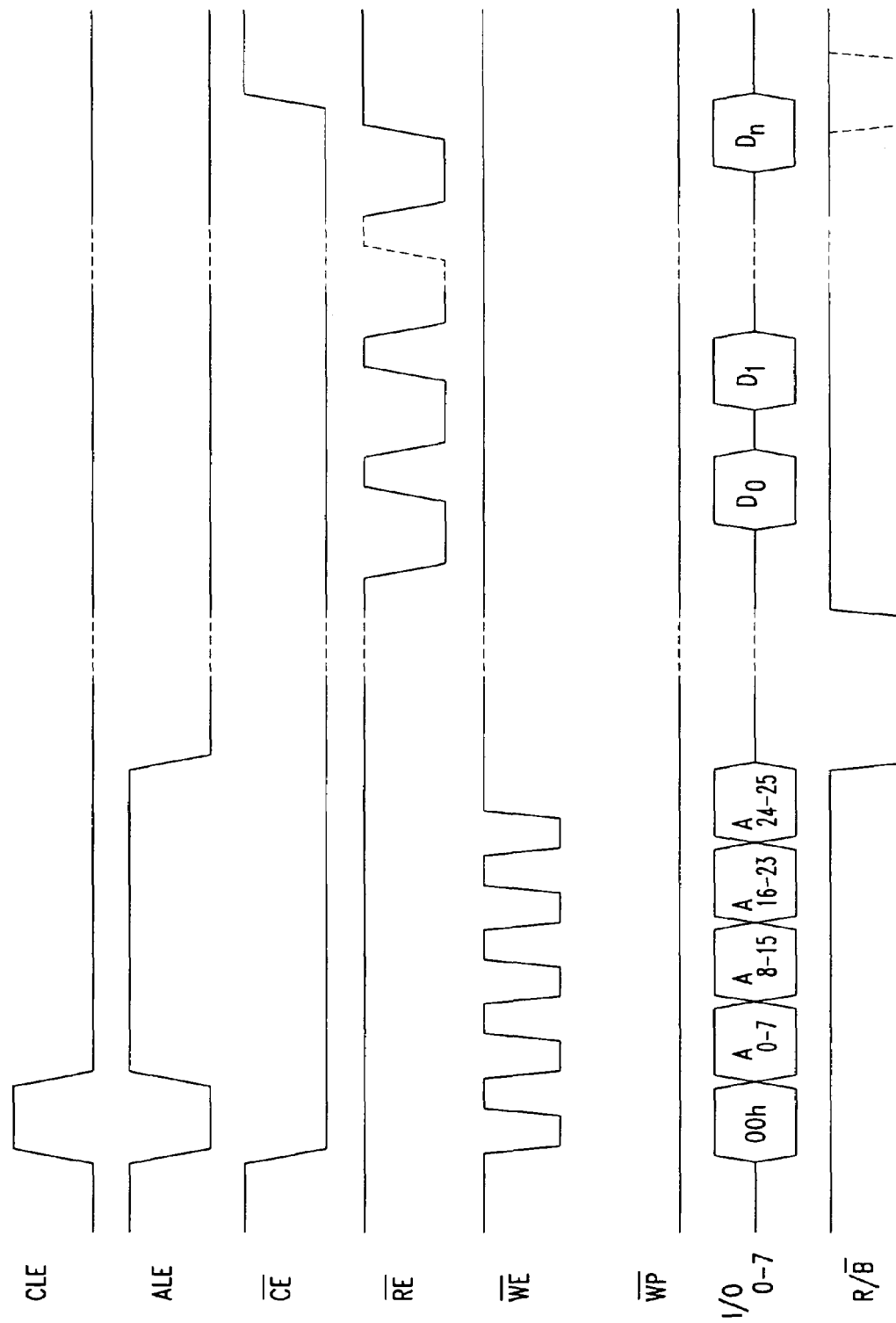
Figure 9B:
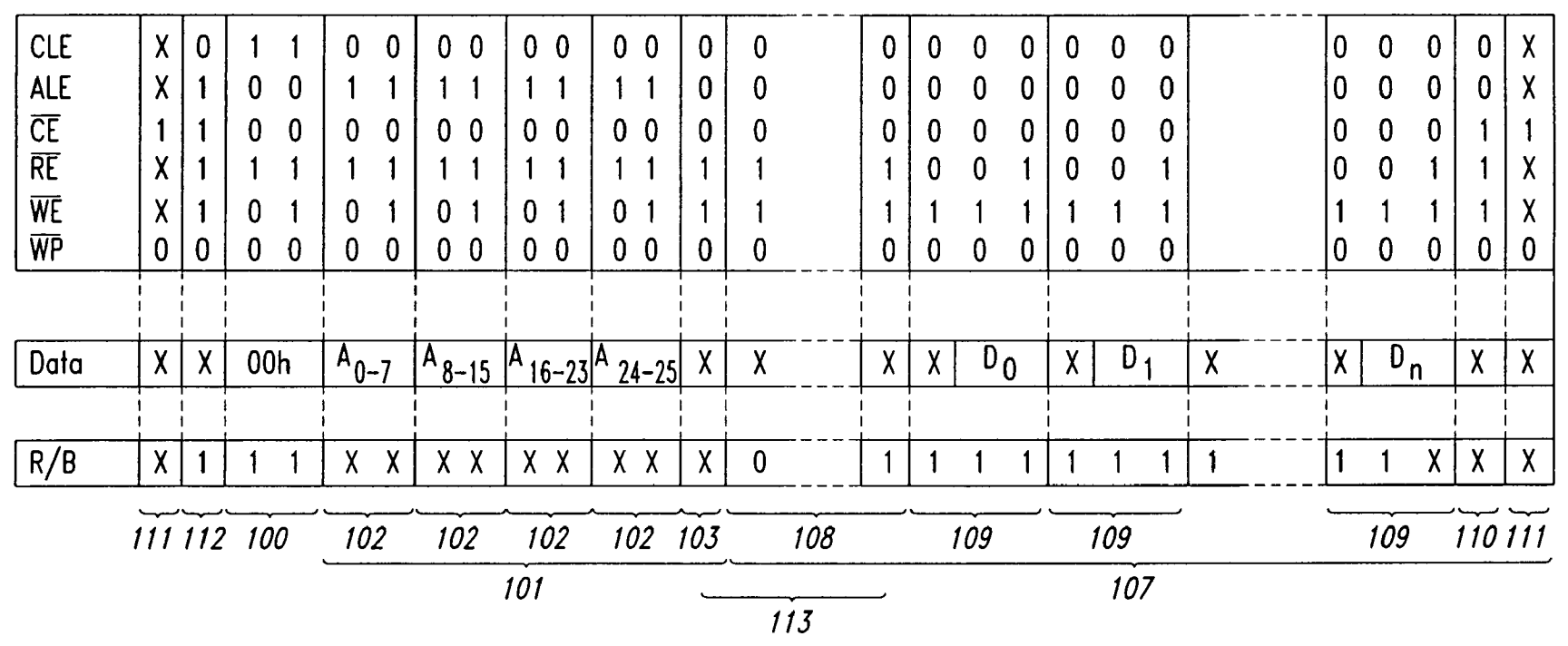

By way of example, FIGS. 9A-9B illustrate a complex read operation. In addition to the sequences corresponding to the elementary commands previously seen with FIGS. 5 to 8, extra sub-sequences have to be added so that the memory is correctly driven and the operations are correctly initialized and terminated. Thus, a sub-sequence 111 is a standby sequence which will be positioned at the output of the command circuit indicating that the memory is not used. The single important control signal is that the circuit enable signal $\overline{CE}$ is set to an inactive state 1. The other signals may be in any state. Prior to the sending of a command, all the signals should on the other hand be set to a start of operation state, this being what the initialization sub-sequence 112 does. The circuit enable signal $\overline{CE}$ still remaining inactive, the other control signals will be set to states rendering them all inactive so as to correctly initialize the complex command. In the case of a data read, the command 00h is sent with the aid of a command write sequence 100. An addressing sequence 101 is then sent. This addressing sequence is immediately followed by a data read sequence 107. The person skilled in the art will note that during a period 113 whose duration is not fixed by the sequencer, the programmable control interface 4 is in a standby situation vis-à-vis the availability signal R/$\overline{B}$. Although the duration of the period 113 is not controllable, the sub-sequence 108 will maintain a state hold as long as this availability signal does not indicate that the memory is ready to output the data. On completion of the data read, a sub-sequence 111 for placing the memory on standby is used.

Figures 10, 11:
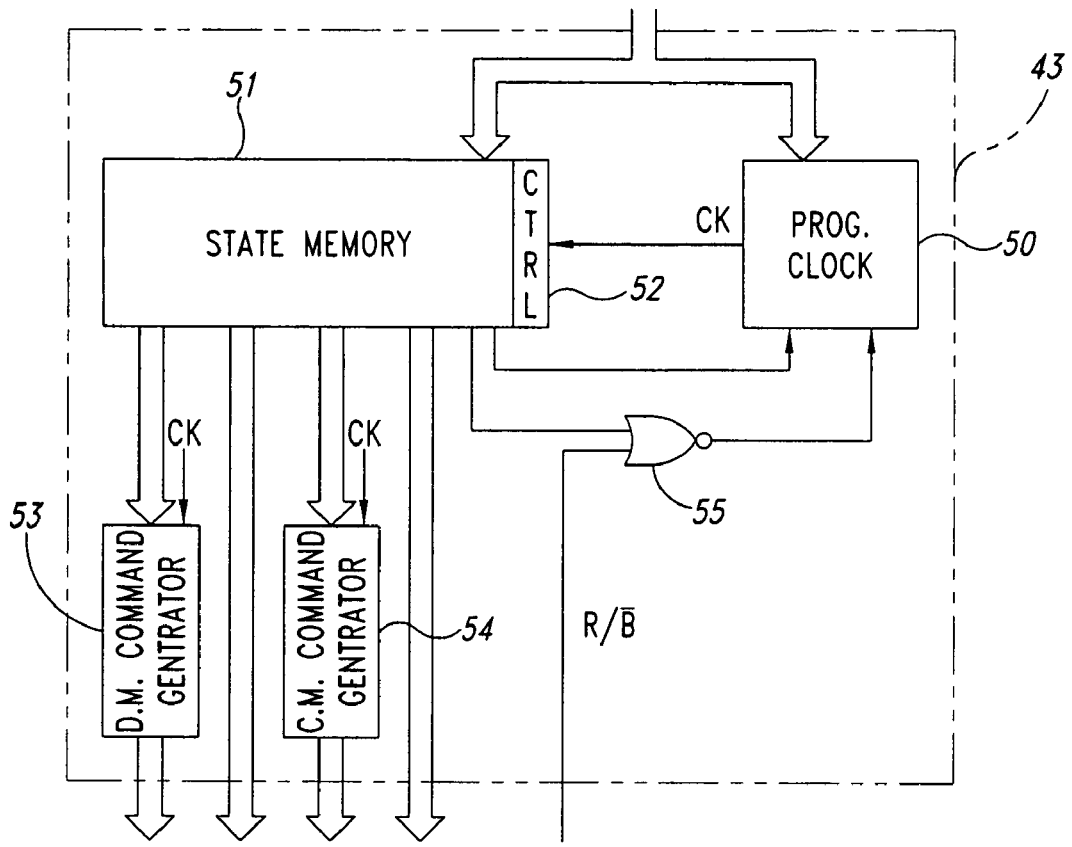
FIG. 10 represents an exemplary embodiment of the programmable state machine according to the invention.
FIG. 11 shows the structure of a word of the state memory used in the circuit of FIG. 10, according to one embodiment of the invention.

In order to carry out a correct sequencing of the various operations to be triggered with the aid of the command memory 41, the state machine 43 must store the various states whereby the various operations may be made to succeed. To do this, the programmable state machine 43 represented in FIG. 10 is for example used. This state machine 43 comprises mainly a programmable clock 50, a state memory 51 controlled by a memory controller 52 itself driven by a clock signal CK originating from the programmable clock 50. The memory controller 52 is, for example, a counter which will increment the addresses of the state memory linearly as a function of the clock signal. The state memory 51 is read linearly. Two command generators 53 and 54 will decode bits received from the state memory so as to transform them into elementary commands for, respectively, the data memory 42 and the command memory 41. These command generators 53 and 54 are also synchronized by the clock signal CK. A neutralization circuit 55, for example a NOR gate receives, on the one hand the memory availability signal R/$\overline{B}$ and, on the other hand a clock control bit originating from the state memory 51. The state memory 51 also supplies a control bit to the programmable clock 50 and supplies commands to the command 44 and data 45 address counters.

The command generator circuits 53 and 54 as well as the memory controller 52 must drive RAM type memories at a speed greater than the sampling period of the signals. In general, it is necessary to have a clock signal CK whose frequency is at least three times greater than the real sampling frequency. By way of example, the clock signal is chosen with a ratio of 3 relative to the sampling signal, this corresponding to a frequency of 120 MHz.

The state memory 51 is a memory whose architecture makes it possible to store words of large dimension. These words of large dimension will comprise a plurality of state bits as well as addresses for loading the command address counters 44 and data address counters 45. The architecture of a word of this state memory 51 is represented in FIG. 11. The word comprises data memory control bits 120, command memory control bits 121, data counter control bits 122, command counter control bits 123 and clock control bits 124. The data memory control bits 120 or command memory control bits 121 comprise, for example, a bit R/$\overline{W}$ indicating whether the memory should operate in read mode or in write mode and another bit ACTIV indicating whether the memory should be active or inactive. The two bits are then sent to the command generator circuit 53 and 54 so as to be translated into a command suitable for the said memory. The data 122 and command 123 counter control bits will be composed, on the one hand, of an incrementation bit INC, of a load bit LOAD and of the address @ to be loaded into the said counter. The clock control bits 124 are, for example, a conditional bit COND which combined with the status signal R/$\overline{B}$ originating from the memory will or will not shut down the clock 50. This conditional bit, when it is in a first state will enable the memory status signal R/$\overline{B}$ and when it is in another state, Will disable it. The enabling or disabling of the memory availability bit or more generally of the status bit of the slave circuit will result in the clock being shut down or not shut down by the said status bit. Among the clock control bits, a stop bit STOP serves to halt the clock definitively, for example when the running of the complex command has terminated. Simultaneously, the change of state of this stop bit can trigger an interrupt destined for the processor so as to indicate to it that the complex command that it requested has been carried out.

With such a state machine 43, the central processor 1 must write into the state memory 51 all the words necessary for the proper running of the sequencing. If one considers the number and the length of the words to be stored, this operation of recording of the various states in the state memory 51 is relatively lengthy. Even if this operation may be interrupted numerous times by other elements of the computing system, nevertheless this operation will require a certain occupancy on the part of the central processor. This solution makes it possible, however, to greatly reduce the occupancy of the central processor when several complex instructions of one and the same type are executed successively. By way of example, the maximum transfer of data that can be carried out with a read or write instruction pertains to 2 kilobytes, if the central processor 1 wishes to transfer a bigger volume of data, it will have to repeat this operation as many times as necessary. It is then sufficient to change only the addresses of the data groups, this being very fast.

Figure 12:
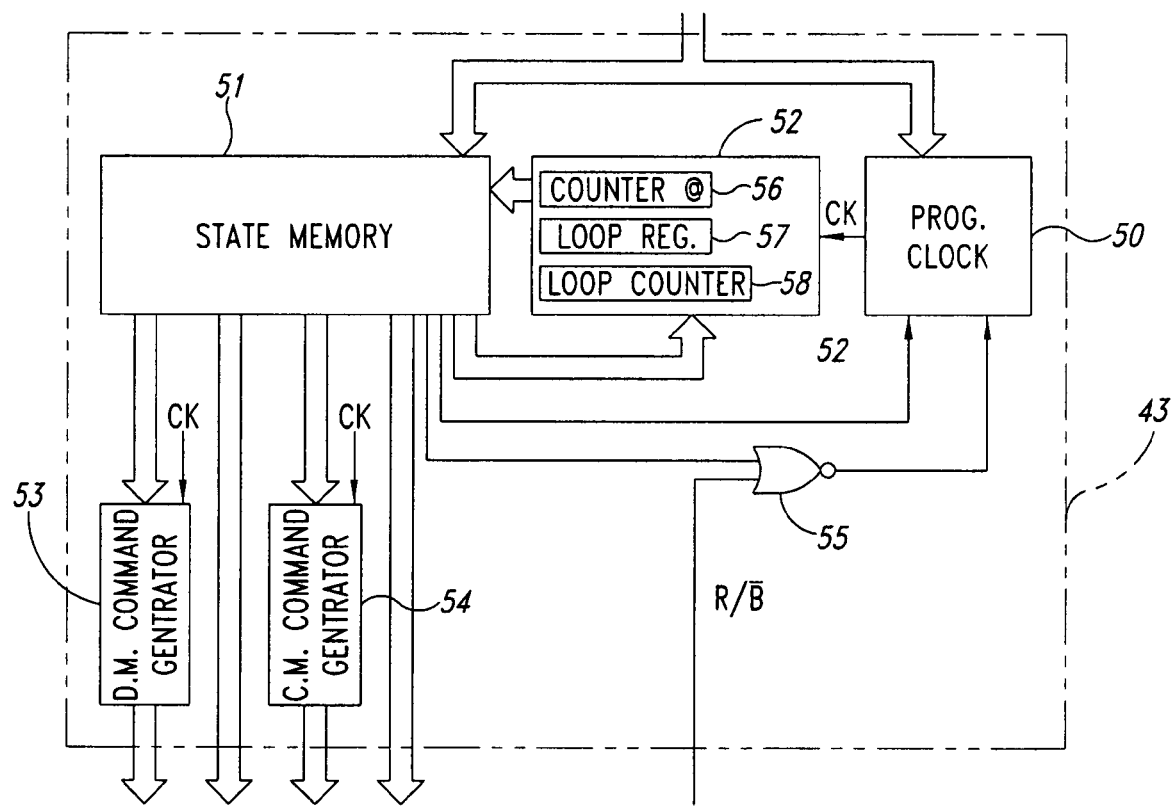
FIG. 12 shows a variant of the circuit of FIG. 10, according to one embodiment of the invention.
Figure 13:
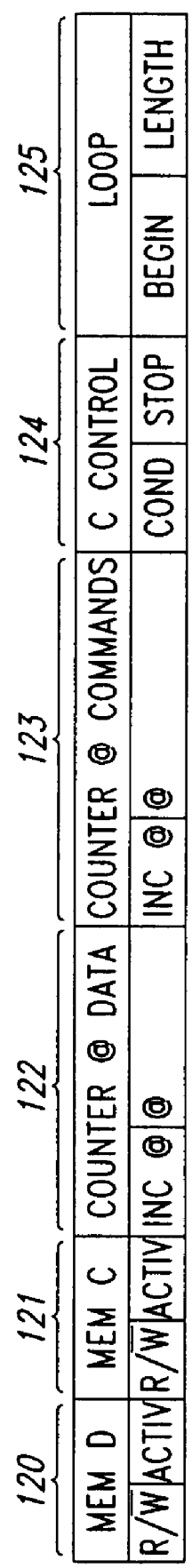
FIG. 13 shows the structure of a state memory word used in the circuit of FIG. 12, according to one embodiment of the invention.

In order to reduce the time to program the programmable interface 4 by the central processor 1 and in order to reduce the size of the state memory 51, a variant is proposed in FIG. 12. This variant aims to store in the state memory 51 only a reduced number of elementary sequences. The elementary sequences which are repeated successively are so by way of loops. Accordingly, the memory controller 52 is furnished with a state address counter 56, with a loop register 57 and with a loop counter 58. The state memory 51 will also store loop control bits 125 destined for the memory controller 52. The loop control bits 125, shown in FIG. 13, are added to the structure of words of the state memory 51. Thus, when an elementary sequence, for example an address write sub-sequence 102 (FIG. 9B) or a data write 105 (FIG. 7) or read 109 (FIG. 8) sub-sequence, is carried out repeatedly, in this instance three or four times for the addresses and up to 528 times for the data, a single sub-sequence will be stored in the state memory 51 and control memory 41. To be able to perform the sub-sequence repeatedly, the loop control bits will be activated. Thus, at the start of each sub-sequence, a start of sequence bit will be activated. When this bit is activated, the loop register 57 will store the address of the address counter 56, and the loop counter 58 will be initialized to one. The last word of the state memory 51 which will correspond to the end of the sub-sequence will for its part store the length of the loop in terms of number of repetitions. This loop length will be compared with the output of the loop counter 58. If the loop counter contains a result less than the loop length, then the address counter 56 is reset to the value stored in the loop register 57 and the loop counter 58 will be incremented. If the output of the loop counter 58 is equal to the loop length, then the loop is terminated. Thus, if there are for example 200 data items to be written, the state memory will store just a single data write sub-sequence which will be repeated 200 times. The data counter 42 will have to be set before the start of the loop, the incrementation of the data counter 42 being done at the end of the loop.

Figure 14:
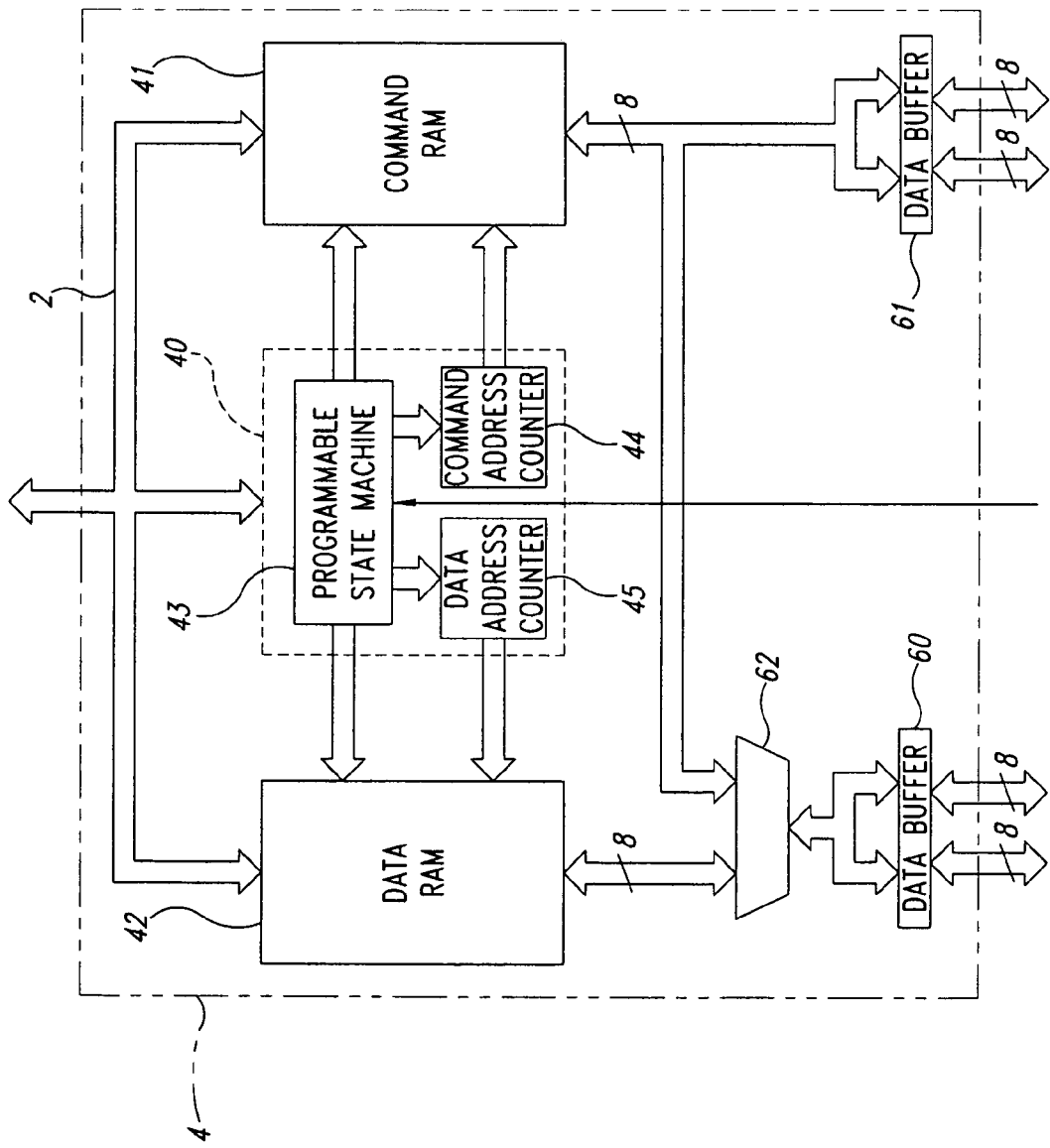
FIG. 14 shows a variant of the programmable interface device according to one embodiment of the invention.

The command interface has been described in conjunction with a FLASH type memory furnished with 8-bit data words and with six command inputs. It goes without saying that the interface is not limited to controlling a single memory but may be addressed to a plurality of circuits. Accordingly, the command bus corresponding to the output of the command memory 41 can comprise many more than 6 bits. In a general manner the memories are organized as 8- or 16-bit words. It is entirely conceivable to have command 41 and data 42 memories architectured with 8-bit words while having 16-bit command and data buses, for example by adding data buffers 60 and 61 as illustrated in FIG. 14. In that case, the command 41, data 42 and state 51 memories will have to be gated twice as fast. Given that the memory circuits used in the programmable interface 4 are much faster random access memory circuits than the FLASH or E²PROM type read only memories using complex commands, these memories may be gated at much higher frequencies.

In the example described previously, the addresses, the commands and the data are all stored in the data memory 42. This makes it necessary to have a storage in the state machine 43 of the location at which the commands, the addresses and the data are found.

In order to simplify the state machine 43 and hence to avoid the need for it to systematically store those addresses, it is possible to eliminate the address jumps in the data memory 42 by storing only the data in the data memory 42 onwards of a first predefined address. In that case, the state memory may be reduced by eliminating the data counter addressing bits. The commands and the addresses are then stored in the command memory 41. The bus of the command memory and the bus of the data memory must then be multiplexed so that on the data input/output it is possible either to exchange data with the data memory 42, or to supply the command words and addresses from the command memory 41. Such a circuit is represented in FIG. 14 which comprises, on the one hand a multiplexer 62 intended to multiplex the data exiting the command memory 41 with the data entering or exiting the data memory 42. The data are multiplexed in a bidirectional manner so as to permit the transfer of data in both directions between the data memory 42. Buffers 60 and 61 are added so as to double the size of the words of the data memory 42 and of the command memory 41 if necessary so as to control more complex circuits furnished either with a 16-bit data input/output bus, or with a number of command signals greater than 8 bits and possibly up to 16 bits.

The programmable interface 4 just detailed may be embodied on an integrated circuit. It is also possible for a single integrated circuit to include the computing system including the programmable interface 4.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A programmable interface device for controlling a slave circuit, wherein any control signal intended to control the slave circuit is previously decomposed into a succession of bits, the succession corresponding to a sampling of the signal with the aid of a sampling signal, a period of which is at most equal to the smallest duration between two changes of state of the control signal, said device comprising:
    a first memory for storing sampled commands of the sampled control signal;
    a first address counter for supplying addresses to said first memory; and
    a programmable state machine for driving the first memory and the first address counter, the state machine including:
    a state memory structured to store first address counter control bits for controlling the first address counter and first memory control bits for controlling the first memory; and
    a state memory controller structured to cause the state memory to output the first address counter control bits and first memory control bits, and thereby cause the first memory to be controlled in response to the first memory control bits and cause the first address counter to be controlled in response to the first address counter control bits.

2. The device according to claim 1 wherein the first memory is designed to store, furthermore, addresses destined for the slave circuit.

3. The device according to claim 1 wherein the first memory is designed, furthermore, to store control words destined for the slave circuit.

4. The device according to claim 1, further comprising:
    a second memory for storing data destined for, and originating from, the slave circuit; and
    a second address counter for supplying addresses to said second memory, the second address counter being driven by the programmable state machine.

5. The device according to claim 4 wherein the second memory is designed, furthermore, to store addresses destined for the slave circuit.

6. The device according to claim 4 wherein the second memory is designed, furthermore, to store control words destined for the slave circuit.

7. The device according to claim 4 wherein the state machine further comprises:
    a programmable clock coupled to the state memory controller and structured to generate a clock signal with a minimum frequency, the minimum frequency being greater than a frequency of the sampling signal.

8. The device according to claim 7 wherein the state memory controller further comprises at least one loop counter for counting the number of times that a line sequence of the state memory is read repeatedly.

9. The device according to claim 7 wherein the state machine further comprises:
    an input for receiving an availability signal originating from the slave circuit; and
    means of neutralization of the programmable clock for halting the programmable clock in response to the availability signal when the availability signal indicates the unavailability of the slave circuit.

10. The device according to claim 4, further comprising at least one multiplexing means for multiplexing at least one data output of the first memory with at least one input/output of the second memory.

11. The device according to claim 4, wherein the slave circuit is a programmable ROM device.

12. The device according to claim 11, wherein the ROM device comprises:
   a command bus configured to supply read and write commands to the slave circuit; and
   a data bus configured to serve as an address bus and as a command bus for complex commands.

13. The device according to claim 1 wherein the device is configured as an integrated circuit.

14. The device according to claim 1 wherein the state machine includes a command generator coupled to the state memory and structured to decode the first memory control bits and produce memory commands that are sent to the first memory and are structured to control the first memory.

15. An electronic system comprising:
   a central processor furnished with a central bus for exchanging data, addresses and commands with other circuits;
   a command bank memory storing at least one set of complex instructions corresponding to at least one slave circuit, the memory being coupled to the central bus; and
   a programmable interface device coupled to the central bus for controlling the at least one slave circuit, the interface device including:
      a first memory for storing the complex instructions;
      a first address counter for supplying addresses to said first memory; and
      a programmable state machine for driving the first memory and the first address counter, the state machine including:
         a state memory structured to store first address counter control bits for controlling the first address counter and first memory control bits for controlling the first memory; and
         a state memory controller structured to cause the state memory to output the first address counter control bits and first memory control bits, and thereby cause the first memory to be controlled in response to the first memory control bits and cause the first address counter to be controlled in response to the first address counter control bits.

16. The system according to claim 15, wherein said system is configured as an on-chip system.

17. The device according to claim 15 wherein the state machine includes a command generator coupled to the state memory and structured to decode the first memory control bits and produce memory commands that are sent to the first memory and are structured to control the first memory.

18. A method, comprising:
   controlling a slave circuit using a control signal, wherein the controlling includes:
   computing a series of sampled commands by decomposing the control signal into a succession of bits by sampling using a sampling signal having a period that is at most equal to a smallest duration between two changes of state of the control signal;
   loading the sampled commands into a first memory;
   loading, into a state memory of a state machine, address counter control bits for controlling a first address counter and first memory control bits for controlling the first memory; and
   after the loading steps, causing the address counter to address the first memory by supplying from the state machine to the address counter the address counter control bits, and supplying from the state machine to the first memory instructions for causing the first memory to provide on an output bus signals intended for commanding the slave circuit.

19. The method according to claim 18, wherein said method further comprises the steps of:
   prior to the step of supplying instructions, loading of data to be written into the slave circuit into a second memory; and
   simultaneously with the step of supplying instructions to the first memory and the address counter control bits to the first address counter, supplying to the second memory and to a second address counter, by the state machine, instructions for supplying on a data bus the data to be written.

20. The method according to claim 18, wherein said method further comprises the steps of:
   simultaneously with the step of supplying instructions to the first memory and the address counter control bits to the first address counter, supplying to a second memory and to a second address counter, by the state machine, instructions for making it possible to copy into the second memory data originating from a data bus of the slave circuit; and
   after having copied the data, the state machine informing a processor that it can proceed with a transfer of the data from the second memory to another circuit.

* * * * *

UNITED STATES PATENT AND TRADEMARK OFFICE
CERTIFICATE OF CORRECTION

PATENT NO. : 7,600,068 B2 Page 1 of 1
APPLICATION NO. : 11/218337
DATED : October 6, 2009
INVENTOR(S) : Chalopin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 424 days.

Signed and Sealed this

Fifth Day of October, 2010

David J. Kappos
*Director of the United States Patent and Trademark Office*